United States Patent [19]

Tanaka et al.

[11] Patent Number: 5,306,702
[45] Date of Patent: Apr. 26, 1994

[54] PROCESS FOR PRODUCING BI-PB-SR-CA-CU-O SUPERCONDUCTING FILMS

[75] Inventors: Atsushi Tanaka; Nobuo Kamehara; Koichi Niwa, all of Kawasaki, Japan

[73] Assignee: Fujitsu Limited, Kawasaki, Japan

[21] Appl. No.: 860,505

[22] PCT Filed: Oct. 17, 1991

[86] PCT No.: PCT/JP91/01423

§ 371 Date: Jun. 17, 1992

§ 102(e) Date: Jun. 17, 1992

[87] PCT Pub. No.: WO92/06923

PCT Pub. Date: Apr. 30, 1992

[30] Foreign Application Priority Data

Oct. 17, 1990 [JP] Japan .................. 2-276507

[51] Int. Cl.$^5$ .................... B05D 5/12; C23C 14/00
[52] U.S. Cl. .................... 505/473; 505/730; 505/731; 505/728; 505/742; 505/476; 427/62; 427/63; 204/192.24
[58] Field of Search .................... 505/1, 730, 731, 728, 505/742; 427/62, 63; 204/192.24

[56] References Cited

FOREIGN PATENT DOCUMENTS 1-282105  11/1989  Japan .
2-26879   1/1990   Japan .
2-170311  7/1990   Japan .
2-175613  7/1990   Japan .

OTHER PUBLICATIONS

Kao et al, "Transformation of Superconducting Phases in (Bi,Pb)-Sr-Ca-Cu-O during Post-Annealing", Jpn. J. Appl. Phys. 28(9) Sep. 1989, pp. L558-L560.
T. W. Clyne & P. J. Withers (Editors) 'Proceedings of The Second European Conference on Advanced Materials and Processes' 24 Jul. 1991, The Institute of Materials, Oxford, UK "Is Texture Necessary to Obtain High Critical Currents in Superconducting Ceramics?", C. M. Grovenor et al. *p. 102, line 1-2, paragraph 3*.
A. Tanaka et al., "Pb-doped Bi-Sr-Ca-Cu-O thin films," *Appl. Phys. Lett.*, vol. 54, No. 14, Apr. 1989, pp. 1362-1364.
A. Tanaka et al., "Composition dependence of high $T_c$ phase formation in Pb-doped Bi-Sr-Ca-Cu-O thin films," *Appl. Phys. Lett.*, vol. 55, No. 12, Sep. 1989, pp. 1252-1254.

*Primary Examiner*—Roy V. King
*Attorney, Agent, or Firm*—Staas & Halsey

[57] ABSTRACT

A process for producing a Bi-based perovskite superconducting film, comprising the steps of forming on a substrate a Pb-film, containing Bi-base material film comprising Bi, Pb, Sr, Ca and Cu in a Bi:Pb:Sr:Ca:Cu molar ratio of (1.9 to 2.1):(1.2 to 2.2, preferably 1.5 to 1.8):2:(1.9 to 2.2):(3 to 3.5) and sintering the Pb-containing Bi-base material film in an oxygen-containing atmosphere. The sintering step includes a main sintering period of 20 to 120 minutes, in which the temperature is raised from a first temperature to a second temperature, with the second temperature being in a range of 850° to 860° C., and the temperature rise in the main sintering period of 20 to 120 minutes being from 3° to 10° C.

12 Claims, 5 Drawing Sheets

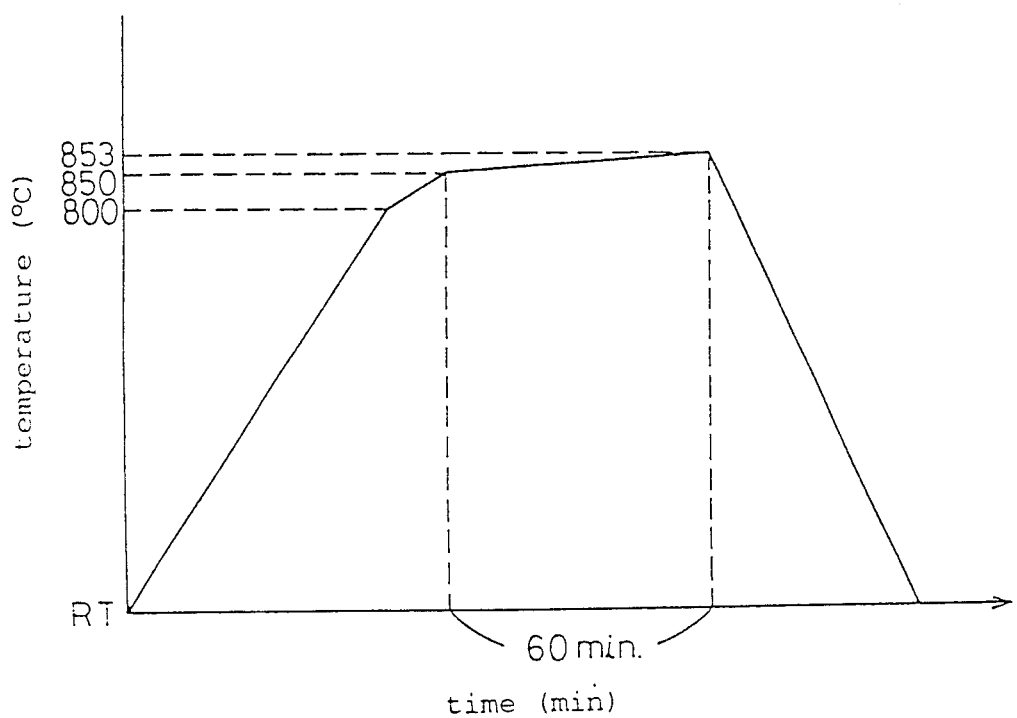

X-Ray Diffraction Pattern of Superconducting Film

PROCESS FOR PRODUCING BI-PB-SR-CA-CU-O SUPERCONDUCTING FILMS

DESCRIPTION

1. Field of the Invention

The present invention relates to a superconducting film, and more particularly to a process for producing a film of a bismuth-base perovskite superconducting material containing lead.

A superconducting film wiring currently practically used in the art is a Bi-based superconducting film wiring.

Examples of the Bi-based superconducting film wiring used in the art include a film comprising a 10 K phase having a superconducting transition temperature, i.e., a critical temperature, Tc, of 10 K at which a normal conducting phase is transferred to a superconducting phase, a film comprising an 80 K phase having a critical temperature, Tc, of 80 K, and a film comprising a 110 K phase having a critical temperature, Tc, of 110 K. Nevertheless, it is known in the art that it is very difficult to prepare a Bi-based superconducting film wiring of a 110 K phase.

In the superconductor field, however, since a high superconducting transition temperature is greatly beneficial when cooling, i.e., allows a reduction of the size of the whole equipment through a simplification of a cooling device, a Bi-based superconducting wiring comprising a 110 K phase should be easily realized.

2. Description of the Related Art

In general, a Bi-based superconducting film has been produced by depositing a material film on a substrate by sputtering, vacuum evaporation or the like and subjecting the material film to a post-heat treatment to synthesize a superconducting film. In this case, the patterning is usually accomplished by using either a mask in the deposition of the superconducting material film or by conducting an etching after the deposition.

A very precise control of the temperature is necessary for producing a Bi-based superconducting film of a 110 K phase, and the formation of a single phase of a 110 K phase without the addition of Pb to the composition has been regarded as very difficult. As the present inventors have already reported (see "Appl. Phys. Lett., 54", pp. 1362-1364 (1989)), since Pb is easily evaporated during sintering, the amount of Pb becomes insufficient even in the case of a film having a wide width, and thus it is not easy to form a Bi-based superconducting film of a 110 K phase.

The present inventors have succeeded in forming a Bi-based superconducting film having a single phase of a 110 K phase by adding Pb in a considerably higher concentration than that in the case of a bulk or the like (see "Appl. Phys. Lett., 55", pp. 1252-1254 (1989)).

To improve the critical current density, Jc, of a Bi-based superconducting film having a single phase of a 110 K phase, it is necessary to get strong electrical couples across grain boundaries. The facilitation of the flow of a current by an improvement in the orientation of the crystal is considered effective for this purpose. In this case, it is important that the grain boundary per se be reduced by increasing the size of the crystal grain diameter, with an improvement in the orientation. In this case also, it is difficult to form a large crystal of a 110 K phase due to the rapid evaporation of Pb during sintering.

In general, in a Bi-based superconducting film, there exists a superconducting phase wherein the critical temperature, Tc, varies depending upon the difference in the number of Cu-O planes contained in the unit cell. Currently, in the Bi-based superconducting film represented by the formula $Bi_2Sr_2Cu_nCu_{n-1}O_x$, there are three known superconducting compounds, i.e., a phase having a Tc of 10 K wherein n is 1, a phase having a Tc of 80 K wherein n is 2, and a phase having a Tc of 110 K wherein n is 3.

The synthesis of a superconducting film of a 110 K phase having the highest critical temperature, Tc, is expected from a practical viewpoint. As described above, however, even in the case of film with a large width pattern, the Pb easily evaporates during sintering and thus the amount of Pb becomes insufficient. For this reason, a technique wherein a relatively large amount of Pb is added has been developed. In this case, however, the amount of the added Pb decreases with an elapse of the sintering time, which causes the rate of formation of the 110 K phase also to be decreased. When Pb is added in a larger amount, the superconducting material film partially melts during sintering to form a 110 K phase, and this partial melting temperature is closely related to the concentration of Pb. Specifically, when the concentration of Pb is high, the superconducting material film unfavorably melts at a low temperature of about 840° C. and the melting becomes remarkable, and this causes the composition to vary from place to place. Consequently, a low temperature phase or a crystal having a small grain diameter is often formed, so that the texture becomes heterogeneous. This causes the critical current density, Jc, and the critical temperature, Tc, to be lowered, and thus favorable results can not be obtained.

SUMMARY OF THE INVENTION

Accordingly, an object of the present invention is to form a large crystal grain through the prevention of an evaporation of a large amount of an evaporateable component such as Pb in an early stage of the sintering and the formation of a heterogeneous texture by using a very simple technique in the sintering of a Bi-based superconducting material film containing Pb, without a lowering in the rate of formation of the 110 K phase.

To attain the above-described object, the present invention provides a process for producing a superconducting film, comprising sintering a film of a Bi-based perovskite superconducting material containing Pb, which includes a step of conducting the sintering while raising the sintering temperature at a small temperature gradient with respect to the sintering time. More specifically, the present invention provides a process for producing a Bi-based perovskite superconducting film, comprising forming on a substrate a Pb-containing Bi-based material film Bi, Pb, Sr, Ca and Cu in a Bi:Pb:Sr:Ca:Cu molar ratio of (1.9 to 2.1):(1.2 to 2.2):2:(1.9 to 2.2):(3 to 3.5) and sintering the Pb-containing Bi-base material film in an oxygen-containing atmosphere for 20 to 120 min, during which a step of conducting the sintering under a sintering condition such that the final sintering temperature is from 850° to 860° C. with a temperature rise of from 3° to 10° C. is conducted.

BRIEF DESCRIPTION OF THE DRAWINGS

FIG. 2 is a sintering temperature profile in Example;

DESCRIPTION OF THE PREFERRED EMBODIMENTS

There is no particular limitation on the substrate on which a superconducting film is formed, and representative examples of the substrate material include MgO, LaAlO$_3$, SrTiO$_3$ and yttria stabilized zirconia (YSZ).

Figure 1A:
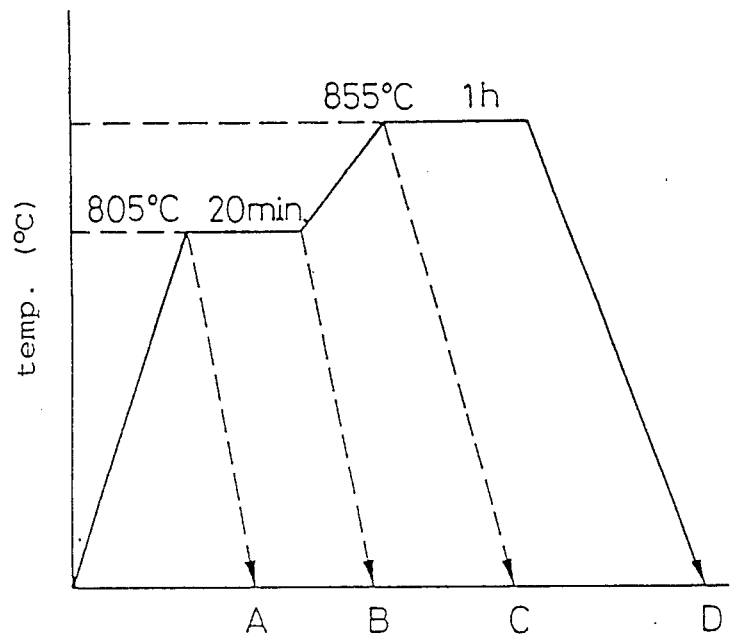
FIG. 1A is a sintering temperature profile for showing a change in the composition ratio of components in the baking step.
Figure 1B:
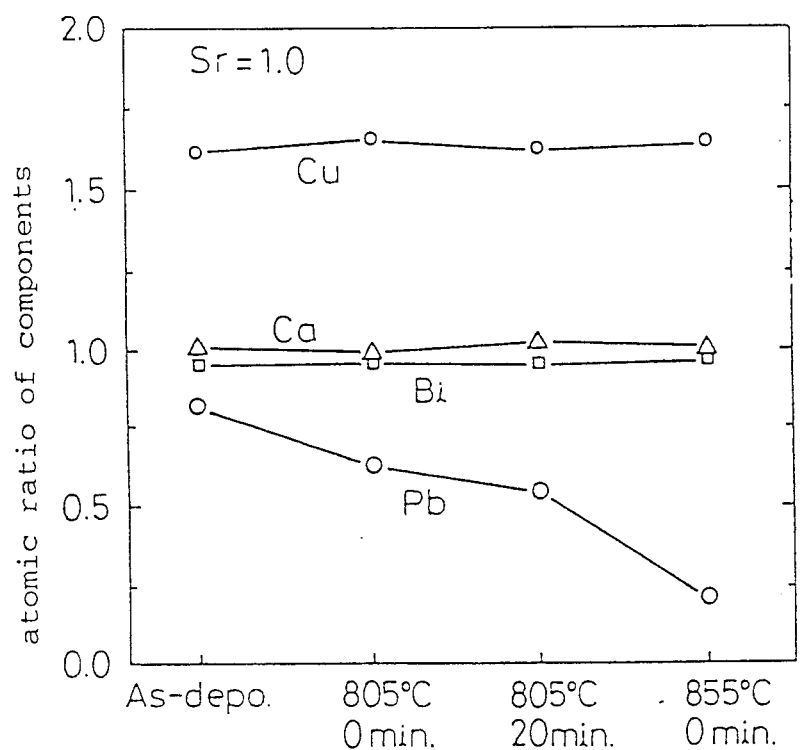
FIG. 1B is a graph showing a change in the composition ratio of components in the sintering step.

A material deposited on the substrate and becoming a Bi-based perovskite superconducting film upon being sintered is a Pb-containing Bi-base material comprising Bi, Pb, Sr, Ca and Cu in a Bi:Pb:Sr:Ca:Cu molar ratio of (1.9 to 2.1):(1.2 to 2.2):2:(1.9 to 2.2):(3 to 3.5). Although a representative composition of the Bi-based perovskite superconductor is represented by Bi$_2$Sr$_2$Ca$_2$Cu$_3$O$_x$, the composition may deviate to some extent from this composition. Preferably Cu is used in a larger amount, and a part of Bi can be substituted with Pb. A composition suitable for the formation of a Bi-based perovskite superconducting film by sintering is as described above. In particular, as described above, Pb should be used in a large amount (1.2 moles or more based on 2 moles of Sr). FIG. 1B is a graph showing a change in the molar ratio of individual components where Bi-Pb-Sr-Ca-Cu-O having a composition as shown at a site of As-depo of FIG. 1B (Bi:Pb:Sr:Ca:Cu=1.9:1.8:2:2.0:3.3) is sputtered to a thickness of 0.8 μm on a substrate and then sintered according to a temperature profile shown in FIG. 1A.

Evaporation of a major portion of Pb is observed in the step of raising the temperature to 855° C. On the other hand, when the amount of Pb is excessively large, as described above, the material is subjected to a remarkable partial melting, to form a heterogeneous crystal phase, and thus a superconductor having a high critical current density, Jc, can not be formed. The molar ratio of Pb is preferably from 1.5 to 1.8 mol, based on 2 mol of Sr.

The Bi-based material containing Pb can be formed on the substrate, for example, by sputtering, vapor deposition or the like. When the material is formed by sputtering, it is possible to laminate oxides of the components. Although the film thickness is from 0.2 to 2 μm in the sputtering process, a thickness of up to about 50 μm can be utilized in the case of a thick film process. The thick film can be formed by dispersing, besides a Bi-based oxide superconductor, an oxide, a carbonate or an acetate of the constituent elements in a nonpolar solvent (benzene, cyclohexane or the like) and subjecting the dispersion to spin coating or screen-printing.

The Pb-containing Bi-based material thus formed is sintered to form a Bi-based perovskite superconducting film. According to the present invention, the sintering is conducted in an oxygen-containing atmosphere, usually in the air, for 20 to 120 min, preferably 20 to 60 min, at a final temperature of 850° to 860° C., preferably 852° to 855° C. so that the temperature is increased by 3° to 10° C., preferably 3° to 5° C., during this period. When the final temperature is above the above-described range, a mixed phase comprising a 10 K phase or an 80 K phase and a 110 K phase is formed. On the other hand, when the final temperature is below the above-described range, a mixed layer composed mainly of an 80 K phase is formed. When the temperature rise during the sintering is smaller than the above-described range, a large crystal grain is not formed. On the other hand, when the temperature rise is larger than the above-described range, a mixed phase comprising a 10 K phase or an 80 K phase and a 110 K phase is unfavorably formed. When the sintering time is excessively short, the formation and growth of a 110 K phase become insufficient. On the other hand, when the sintering time is excessively long, the 110 K phase begins to decompose. It is obvious that the sintering time does not include a period of time taken for raising the temperature from room temperature to the sintering temperature. The sintering is usually conducted under atmospheric pressure. After the sintering, a furnace cooling or gradual cooling is conducted according to a conventional method.

Thus, when the sintering is conducted under the conditions specified in the present invention, in the early stage of sintering wherein a large amount of Pb is contained in the Bi-based material film and the partial melting temperature is low, since the sintering temperature is relatively low, the evaporation of an easily evaporateable component, such as Pb, is prevented, and at the same time, the formation of a heterogeneous structure due to excessive melting is prevented. Further, in this stage, since a large amount of Pb is still contained, the compound serves as a flux, so that a 110 K phase is formed even when the sintering temperature is low. In the stage wherein the sintering proceeds, since the Pb content decreases and the partial melting temperature shifts towards the high temperature side, a lowering in the rate of synthesis of the 110 K phase is compensated for by gradually raising the sintering temperature. Thus, useful utilization of Pb in the synthesis of the 110 K phase prevents the structure from becoming heterogeneous, enables a large crystal grain to be synthesized and enables a sufficiently high critical temperature, Tc, and a sufficiently high critical current density, Jc, to be realized. There is no particular limitation on the amount of Pb contained in the Bi-based perovskite superconducting film prepared by the sintering, and although the Pb may remain in a large amount, it is generally contained in an amount of 0.3 mol or less based on 2 mol of Sr.

If necessary, the resultant Bi-based perovskite superconducting film may be subjected to patterning.

EXAMPLE

MgO was mounted as a substrate on a ridio-frequency magnetron sputtering apparatus, and Bi-Sr-Ca-Cu-O (Bi:Sr:Ca:Cu=3:2:2:3.5) and PbO were used as targets. Discharging was conducted in an Ar/O$_2$ mixed gas (Ar:O$_2$=1:1) to deposit to a thickness of about 1 μm a Bi-based material for forming a superconducting film having the following composition (molar ratio).

Bi:Pb:Sr:Ca:Cu=2.0:1.6:2.0:2.0:3.2.

Then, the formed Bi-based material film was sintered in the air. The temperature profile used in this case is shown in FIG. 2. The abscissa represents sintering time, and the ordinate represents temperature. As can be seen from FIG. 2, the temperature was raised from room temperature to 800° C. at a temperature rise rate of 10° C./min and then raised to 850° C. at a temperature rise rate of 2° C./min, and the material film was then sintered for 60 min. During the sintering, the temperature was raised by 3° C. to a final sintering temperature of 853° C. The reason why the temperature rise rate was lowered to 2° C./min between 800° C. and 850° C. was to prevent overshoot to a temperature above the sintering temperature. After the sintering, the sintered material film was subjected to furnace cooling.

The superconducting film after the sintering had the following composition (molar ratio), and substantially the whole amount of Pb was evaporated.

Bi:Pb:Sr:Ca:Cu = 2.0:0.1:2.0:2.0:3.2.

Figure 3:
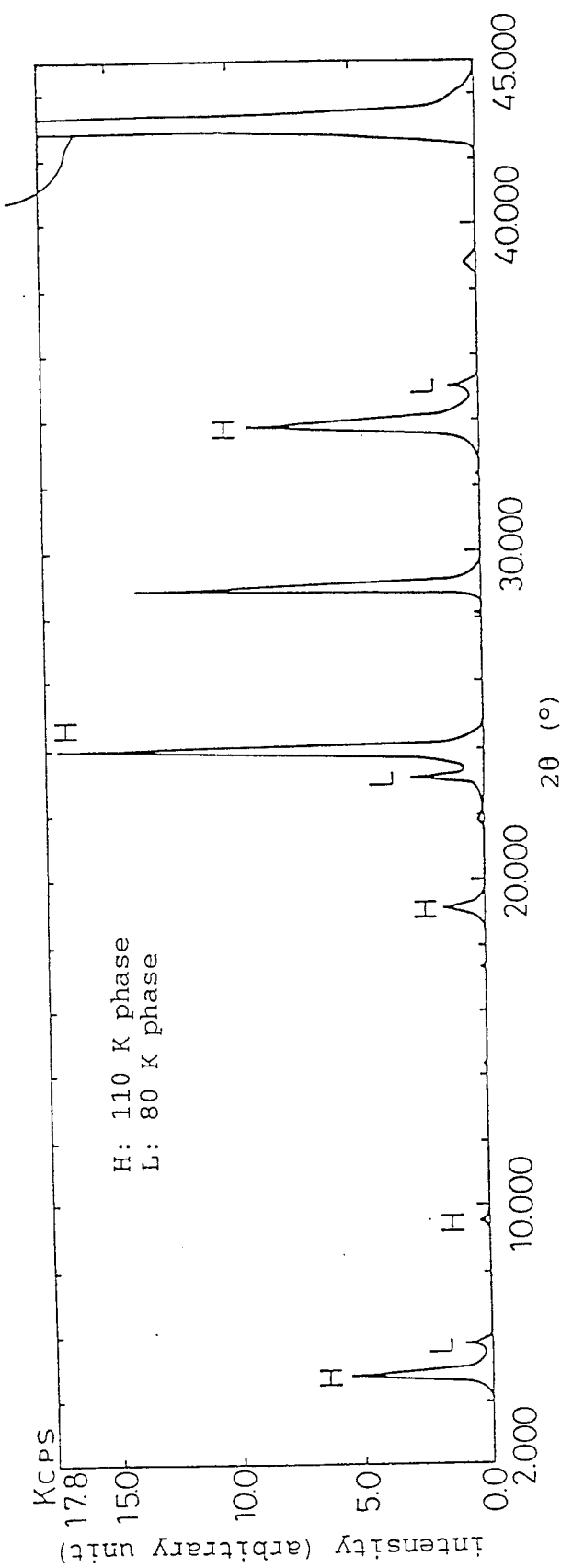
FIG. 3 is an X-ray diffraction pattern of a superconducting film prepared according to an example of the present invention.

An X-ray diffraction pattern of this superconducting film is shown in FIG. 3. FIG. 3 suggests that a Bi-based perovskite superconductor is prepared. Peaks H and L are attributable to a 110 K phase and an 80 K phase, respectively, and it is apparent that most of the peaks in the X-ray diffraction pattern are H, i.e, attributable to the 110 K phase.

Figure 4:
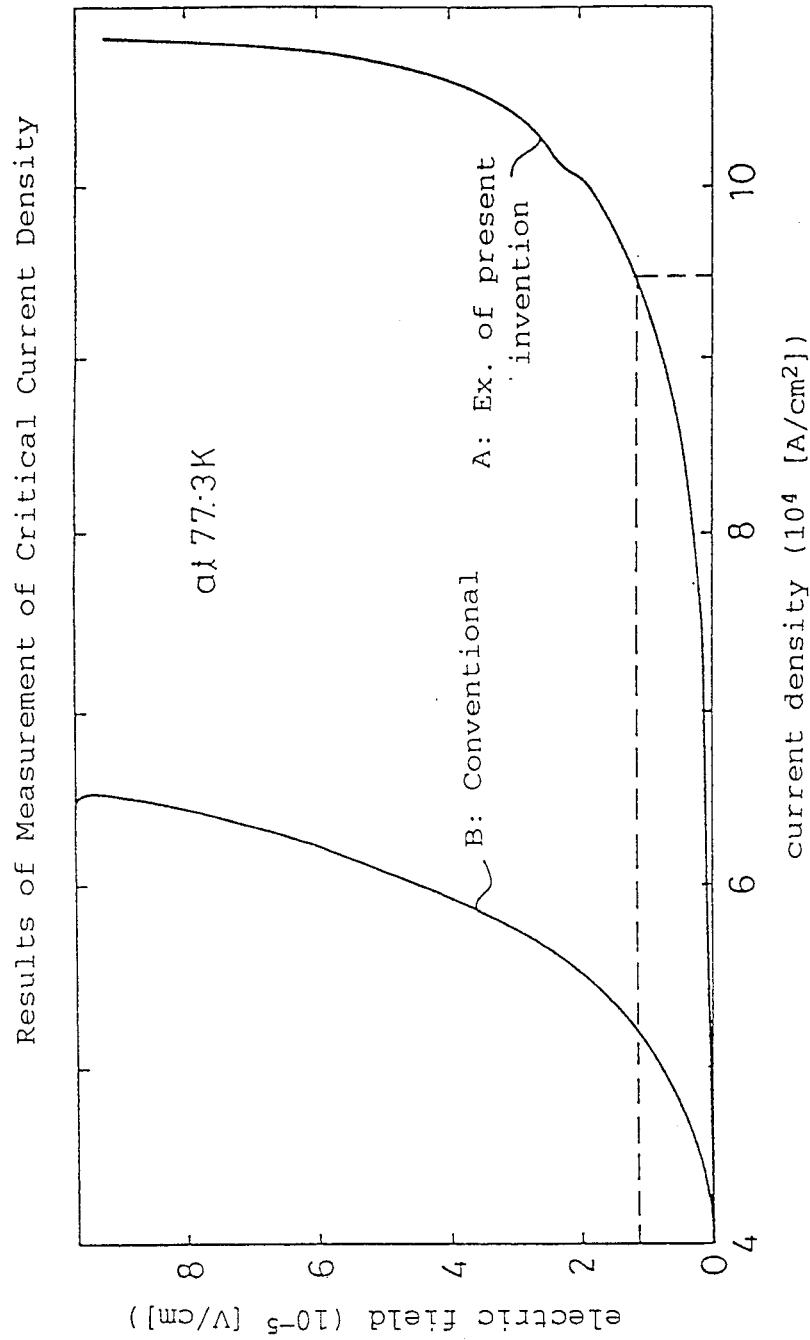
FIG. 4 is a graph showing a current density of a superconducting film prepared according to an example of the present invention.

FIG. 4 is a graph showing the results of measurement of the critical current density, Jc, by a four-terminal method after cooling the same superconducting film material to 77.3 K. The abscissa represents the current density and the ordinate represents the electric field strength in the superconducting film. In FIG. 4, a curve A is a characteristic curve for the film of the Example of the present invention, and a curve B is a characteristic curve for a conventional example of a film for comparison purpose. In the conventional example, a Bi-based material film having the same composition as that of the Example according to the present invention was formed under the same condition as that of the Example, and sintering was conducted under the same condition as that of the Example, except that the sintering was conducted at a constant temperature of 855° C. for 60 min.

It can be seen that in the Example of the present invention, a remarkable improvement in the current density is attained over the current density in the conventional example. When the critical current density, Jc, is defined in terms of electric field 10 $\mu$V/cm, it is $1 \times 10^5$ A/cm$^2$, i.e., a sufficiently large value. On the other hand, in the conventional example, the critical current density is as low as one-third of the critical current density in the Example.

Figure 5:
FIG. 5 is an electron photomicrograph of a superconducting film prepared according to an example of the present invention.
Figure 6:
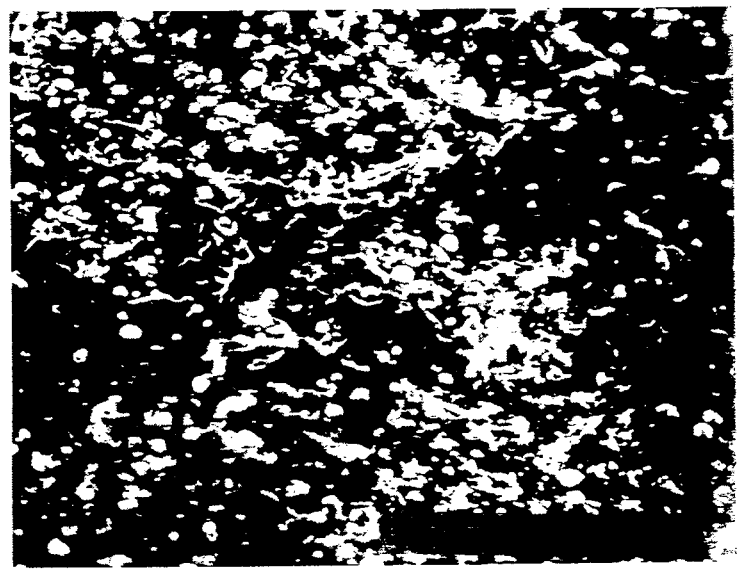
FIG. 6 is an electron photomicrograph of a superconducting film prepared according to a conventional example.

These samples, i.e., an electron photomicrograph of the Example of the present invention and an electron photomicrograph of the conventional example, are respectively shown in FIGS. 5 and 6 (as indicated on a 10-$\mu$m scale, the magnification in the microphotograph in the Example of the present invention is twice that in the microphotograph in the conventional example). In the Example of the present invention (see FIG. 5), a homogeneous crystalline structure is formed, whereas in the Conventional Example (see FIG. 6), a trace of partial melting is observed, and the crystalline structure (crystalline phase and grain diameter) is heterogeneous.

The superconducting film prepared according to the present invention exhibits a high critical temperature of 100 K or above and a high critical current density, Jc, of about $1 \times 10^5$ A/cm$^2$ when defined in terms of 10 $\mu$V/cm, and can be utilized as a high-temperature superconducting film for a circuit board for a large-capacity computer, and a wiring material for a high-speed digital communication circuit board, etc.

We claim:

1. A process for producing a Bi-based perovskite superconducting film, comprising the steps of forming on a substrate a Pb-containing Bi-based material film comprising Bi, Pb, Sr, Ca and Cu in a Bi:Pb:Sr:Ca:Cu molar ratio of (1.9 to 2.1):(1.2 to 2.2):2:(1.9 to 2.2):(3 to 3.5) and sintering the Pb-containing Bi-based material film in an oxygen-containing atmosphere, said sintering step including a main sintering period of 20 to 120 minutes, in which the temperature of said film is raised from a first temperature to a second temperature, said second temperature being in a range of 850° to 860° C., and the temperature rise in said main sintering period of 20 to 120 minutes is from 3° to 10° C.

2. A process according to claim 1, wherein the temperature is raised to said first temperature prior to said main sintering period, and said film is cooled subsequent to said main sintering period.

3. A process according to claim 2, wherein said Pb-containing Bi-based material film is represented by $Bi_aPb_xSr_2Ca_bCu_cO_z$ wherein a is a value of from 1.9 to 2.1, x is a value of from 1.2 to 2.2, b is a value of from 1.9 to 2.2, c is a value of from 3 to 3.5 and z is a stoichiometric amount determined depending upon the amounts of Bi, Pb, Sr, Ca and Cu.

4. A process according to claim 2, wherein said Pb-containing Bi-based material film is represented by $Bi_aPb_xSr_2Ca_bCu_cO_z$ wherein a is a value of from 1.9 to 2.1, x is a value of from 1.5 to 1.8, b is a value of from 1.9 to 2.2, c is a value of from 3 to 3.5 and z is a stoichiometric amount determined depending upon the amounts of Bi, Pb, Sr, Ca and Cu.

5. A process according to claim 2, wherein the temperature rise during said main sintering period is of from 3° to 5° C.

6. A process according to claim 2, wherein said sintering is conducted in the air.

7. A process according to claim 2, wherein said film has a thickness of 50 $\mu$m or less.

8. A process according to claim 2, wherein the final temperature of the sintering is 852° to 855° C.

9. A process according to claim 2, wherein the sintering is conducted for 20 to 60 min.

10. A process according to claim 2, wherein said Pb-containing Bi-based material film is formed on the substrate by sputtering.

11. A process according to claim 2, further comprising a step of conducting patterning after the formation of said superconducting film.

12. A process according to claim 2, wherein said Bi-based perovskite superconducting film obtained by said sintering is represented by $Bi_aPb_xSr_2Ca_bCu_cO_z$ wherein a is a value of from 1.9 to 2.1, x is a value of 0.3 or less, b is a value of from 1.9 to 2.2, c is a value of from 3 to 3.5 and z is a stoichiometric amount determined depending upon the amounts of Bi, Pb, Sr, Ca and Cu.

* * * * *

UNITED STATES PATENT AND TRADEMARK OFFICE
CERTIFICATE OF CORRECTION

PATENT NO. : 5,306,702
DATED : Apr. 26, 1994
INVENTOR(S) : TANAKA et al.

It is certified that error appears in the above-indentified patent and that said Letters Patent is hereby corrected as shown below:

On the title page, item [54] and column 1, line 2, change "BI-PB-SR-CA-CU-O" to --Bi-Pb-Sr-Ca-Cu-O--.

ABSTRACT, line 3, change "Pb-film, containing" to --Pb-containing--.

Col. 2, line 6, change "$Bi_2Sr_2Cu_nCu_{n-1}O_x$" to --$Bi_2Sr_2Ca_{n-1}Cu_nO_x$--.

Signed and Sealed this

Tenth Day of June, 1997

BRUCE LEHMAN

*Attest:*

*Attesting Officer*    *Commissioner of Patents and Trademarks*